United States Patent
Gunten et al.

[11] Patent Number: 6,140,575
[45] Date of Patent: Oct. 31, 2000

[54] SHIELDED ELECTRONIC CIRCUIT ASSEMBLY

[75] Inventors: Lamar Van Gunten, Atherton; Sandeep Patel, San Jose, both of Calif.

[73] Assignee: 3Com Corporation, Santa Clara, Calif.

[21] Appl. No.: 08/959,607

[22] Filed: Oct. 28, 1997

[51] Int. Cl.[7] .................................................. H05K 9/00
[52] U.S. Cl. ........................................ 174/35 R; 361/753
[58] Field of Search .................................. 174/35 R, 51; 361/800, 816, 818, 799, 753

[56] References Cited

U.S. PATENT DOCUMENTS

| | | | |
|---|---|---|---|
| 4,037,009 | 7/1977 | Severinsen | 428/241 |
| 4,384,165 | 5/1983 | Loving, Jr.et al. | 174/35 GC |
| 4,658,334 | 4/1987 | McSparran et al. | 361/800 |
| 4,853,790 | 8/1989 | Dickie | 358/245 |
| 5,068,493 | 11/1991 | Benn, Sr. et al. | 174/35 GC |
| 5,072,070 | 12/1991 | Balsells | 174/35 GC |
| 5,105,056 | 4/1992 | Hoge, Jr. et al. | 174/35 GC |
| 5,141,770 | 8/1992 | Benn, Sr. et al. | 427/58 |
| 5,196,712 | 3/1993 | Nguyen et al. | 250/551 |
| 5,311,408 | 5/1994 | Ferchau et al. | 361/818 |
| 5,414,597 | 5/1995 | Lindland et al. | 361/816 |
| 5,473,111 | 12/1995 | Hattori et al. | 174/35 R |
| 5,557,063 | 9/1996 | Mottahed | 174/35 GC |
| 5,559,677 | 9/1996 | Errichiello | 361/816 |
| 5,586,011 | 12/1996 | Alexander | 361/818 |
| 5,597,979 | 1/1997 | Courtey et al. | 174/35 R |

*Primary Examiner*—Dean A. Reichard
*Assistant Examiner*—Hung V Ngo
*Attorney, Agent, or Firm*—Wilson Sonsini Goodrich & Rosati

[57] ABSTRACT

A shielded electronic circuit assembly is disclosed. An enclosure formed of a composite material comprising a structural material and a conductive material closes along a perimeter to surround an electronic circuit assembly. The conductive material can be embedded in or laminated or coated on the surface of the structural material to provide a composite material with sufficient conductivity to provide shielding from electromagnetic interference. The enclosure can further contain a conductive elastomeric bead, interlocked joint, or compression fit along the perimeter to assure that good conductive contact is achieved and maintained along the perimeter when the enclosure is closed. The enclosure is conductively coupled to ground.

31 Claims, 3 Drawing Sheets

SHIELDED ELECTRONIC CIRCUIT ASSEMBLY

BACKGROUND OF THE INVENTION

1. Field of the Invention

The present invention relates to improvements in electromagnetic shielding and in particular to shielding of electrical circuit assemblies and subassemblies.

2. Description of the Related Art

Isolation of circuit components from electromagnetic interference is particularly important in communications equipment, such as cable modems, cellular telephone units and related relay-station equipment having components that operate in the 10 MHz to 4 GHz frequency range. The typical RF isolation shield for electronic components in such units consists of a rectangular metallic enclosure. In order to provide adequate shielding, radiation attenuation of greater than 60 dB, typical shields are often pressure-fit with conductive gaskets, using a large number of screws or soldering.

Metallic shields may be attached and grounded by soldering; however, soldering can significantly increase the manufacturing expense of the product. Furthermore, soldering may not be reliable, especially if the shield is to be removed and reattached for repair or replacement of circuit components. After reattachment, air gaps in the seal caused by the roughness of the solder from which the shield was removed may remain. Moreover, such shields may be difficult to unsolder and the unsoldering operation itself is risky, possibly causing heat damage to electronic components or delamination of portions of the assembly. Furthermore, the use of conductive gaskets and screws for attaching such shields is expensive and labor-intensive due to the large number of screws needed to prevent EMI leakage and provide an adequate seal.

Circuits may be sensitive to electromagnetic interference for a variety of reasons, including high gain, operation at high frequencies, and the use of components and structures conducive to inductive or capacitive coupling. The same qualities also characterize circuits that emit offending high-frequency electromagnetic radiation. To attenuate an electromagnetic field in such situations, conductive material may be arranged in a complete conductive enclosure. The surface of the enclosure ideally is in close proximity to the surface of the circuit. Typical metal enclosures, however, are rectangular, the height of the enclosure being chosen to allow clearance for the tallest component on the circuit being shielded. Complex geometries are often avoided due to the relatively high cost of casting, soldering, welding, or machining such structures.

In view of the operational frequencies and character of many modem circuits, it is desirable that shielding for electromagnetic interference purposes attenuates radiation at least by 50 to 60 dB over a frequency range from 10 MHz to 4.0 GHz or more. To achieve this, the shield ideally is substantially continuous and encloses the shielded circuits closely and completely, i.e., forming a closed, highly conductive enclosure. Electromagnetic shielding for attenuating electromagnetic interference typically has a resistivity of 0.57 m$\Omega$/mm$^2$.

It would be advantageous to provide an enclosure for providing electromagnetic shielding for a circuit assembly that is easy to manufacture.

It would also be advantageous for the shield to allow the circuit assembly to be easily and repeatably accessed by opening the shield enclosure, without compromising the integrity of the closed shield.

SUMMARY OF THE INVENTION

An aspect of the invention is directed to a shielded electronic circuit assembly, wherein the shield is cheap and easily assembled and the shield material can be shaped or molded to form a shield enclosure that conforms to the circuit assembly while maintaining the high conductivity necessary for effective electromagnetic shielding. In a first embodiment, the shielded electronic circuit assembly comprises an enclosure and an electronic circuit assembly. The enclosure is formed of a composite material comprised of a nonmetallic structural material and a conductive material. The enclosure closes along a perimeter so as to provide conductive contact along the perimeter, surrounding the electronic circuit assembly and providing shielding from electromagnetic interference. The enclosure is conductively coupled to ground.

In a second embodiment, the shielded electronic circuit assembly comprises a structural nonmetallic material and a conductive material, the conductive material providing electromagnetic-interference shielding. The structural nonmetallic material and the conductive material form an enclosure surrounding an electronic circuit assembly. The enclosure includes a top portion, a bottom portion, and a closing mechanism holding the top portion in conductive contact with the bottom portion. The enclosure further contains at least one opening through which conductive wires can pass, allowing electronic signals to be input to and output from the electronic circuit assembly. In addition, the enclosure is conductively coupled to ground.

In another embodiment, the shielded electronic circuit assembly comprises a structural nonmetallic material and a conductive material. The conductive material provides electromagnetic interference shielding. The structural nonmetallic material and the conductive material form an enclosure surrounding an electronic tuner assembly. The enclosure includes a top portion, a bottom portion, and a locking mechanism allowing the top portion to be held in conductive contact with the bottom portion. The enclosure further contains at least one opening through which conductive wires can pass, allowing electronic signals to be input to and output from the electronic tuner assembly. A mounting bracket is coupled to the enclosure. The bracket couples the electronic tuner assembly to the enclosure such that the conductive material does not short-circuit the electronic tuner assembly. The shape of the enclosure matches the shape of the electronic tuner assembly, so that a small insulating gap is maintained between the inside surface of the enclosure and the surface of the electronic tuner assembly. According to one aspect of the invention, the enclosure reduces electromagnetic interference by at least 60 dB over a frequency range from 10 MHz to 4 GHz and the enclosure is conductively coupled to ground.

DETAILED DESCRIPTION

Figure 1A:
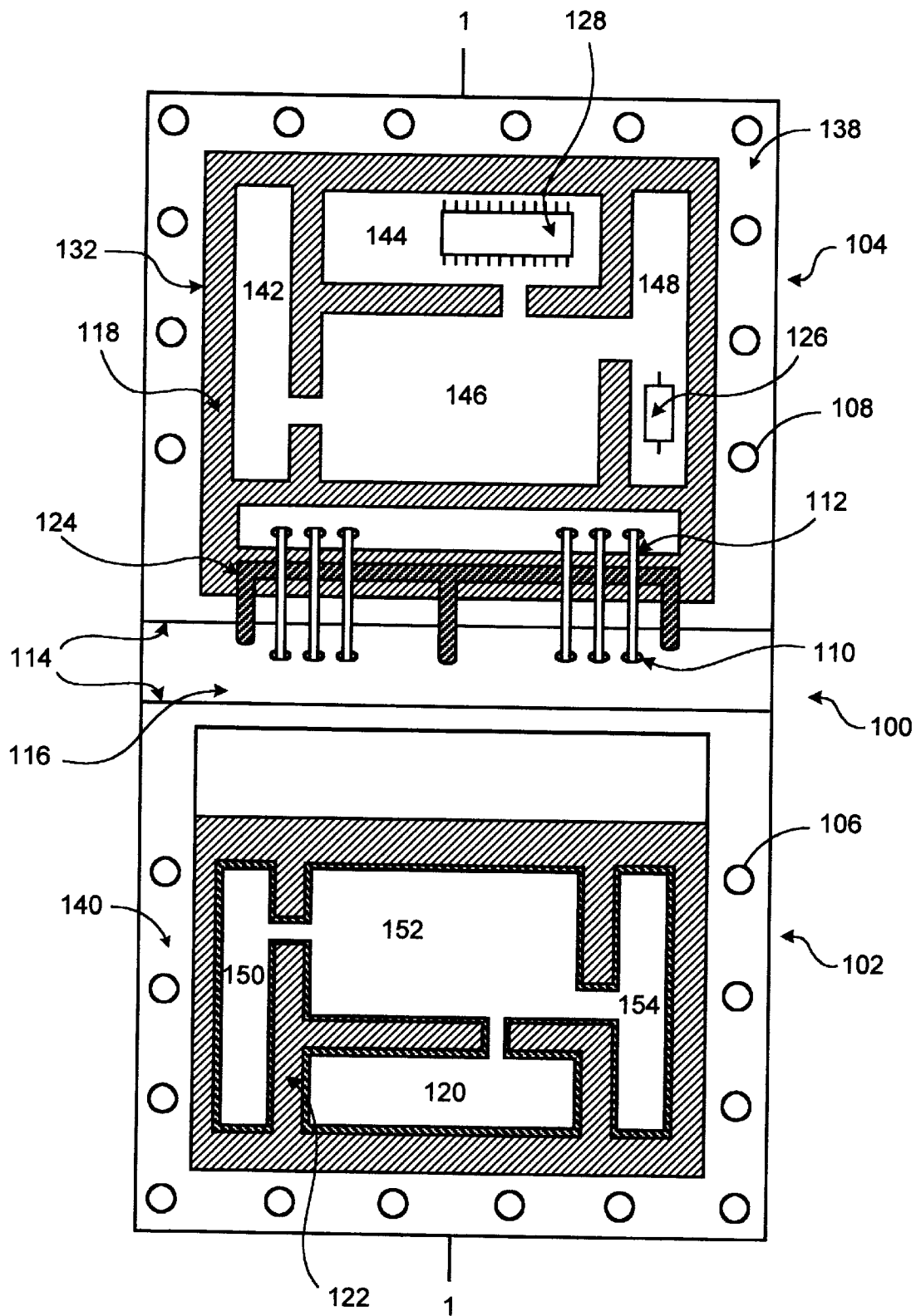
FIG. 1A is a top plan view of an embodiment of the shielded electronic circuit assembly of the present invention.

Referring to FIG. 1A, a top plan view of an embodiment of the shielded electronic circuit assembly of the present invention is shown. A shielding material, described below, is molded or shaped by well-known methods into an electromagnetic isolation shield enclosure 100, as shown in FIGS. 1A, 1B, 1C and 1D. Enclosure 100 is comprised of bottom portion 104, top portion 102, and hinges 114 positioned along hinged-edge 116 of enclosure 100. Enclosure 100 is shaped to contain circuit assembly 132, leaving only a small insulating gap between edge 138 of enclosure 100 and the edge of circuit assembly 132. Circuit assembly 132 can, for example, be a cable modem tuner or other electronic circuit device. Hinges 114 are constructed to allow top portion 102 of enclosure 100 to be folded over circuit assembly 132 and conductively fastened to bottom portion 104 along perimeter 138, thereby completely surrounding circuit assembly 132 with electromagnetic isolation shield enclosure 100.

The shielding material can be comprised of a composite material formed of an insulating polymer or plastic embedded with a conductive material in the form of a mesh or coupled fiber network or the like. The composite material is sufficiently rigid to hold form and support circuit assembly 132, while being easily produced in complex shapes so as to allow the shape of enclosure 100 to closely match that of circuit assembly 132, and further allowing the formation of sub-enclosures to isolate subregions of circuit assembly 132. The structural material is also flexible enough to ensure that it can fasten around its perimeter over the circuit assembly without requiring expensive manufacturing tolerances. The embedded conductive material is cross-linked and sufficiently dense to provide a resistivity of $0.57 \times m\Omega/mm^2$ or not more than $0.75\ m\Omega/mm^2$.

Additionally, the composite material can be laminated or coated on one or both sides, using well-known methods, with a conductive material such as aluminum, copper, silver, gold, or other conductive material to increase the conductivity and shielding effectiveness of the composite material. The shielding material can comprise a nonembedded polymer or plastic material laminated or coated with a conductive material.

In one embodiment of the invention, the composite material consists of a polyvinylchloride (PVC) or polyester structural material. The PVC or polyester structure is coated on the inside with a urethane binder embedded with a conductive copper/silver material.

Figure 1B:
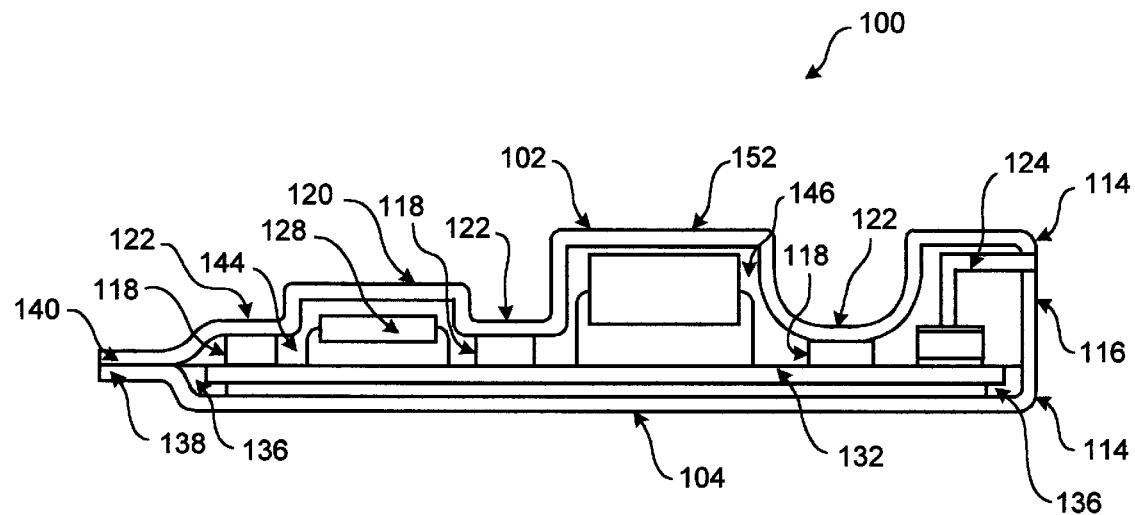
FIG. 1B is a cross-section view of an embodiment of the shielded electronic circuit assembly of the present invention along line 1—1 of FIG. 1A.
Figure 1C:
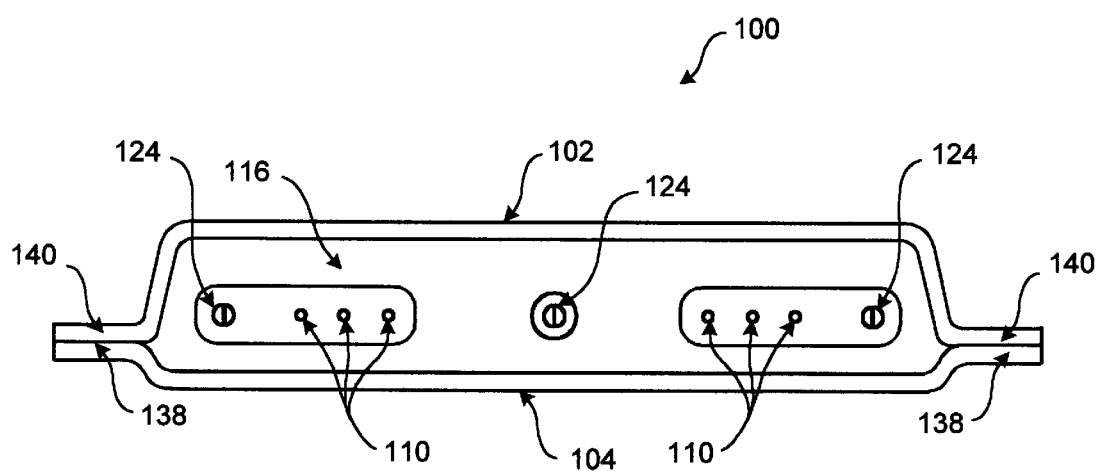
FIG. 1C is a side elevation view facing the hinged edge of an embodiment of the shielded electronic circuit assembly of the present invention.
Figure 1D:
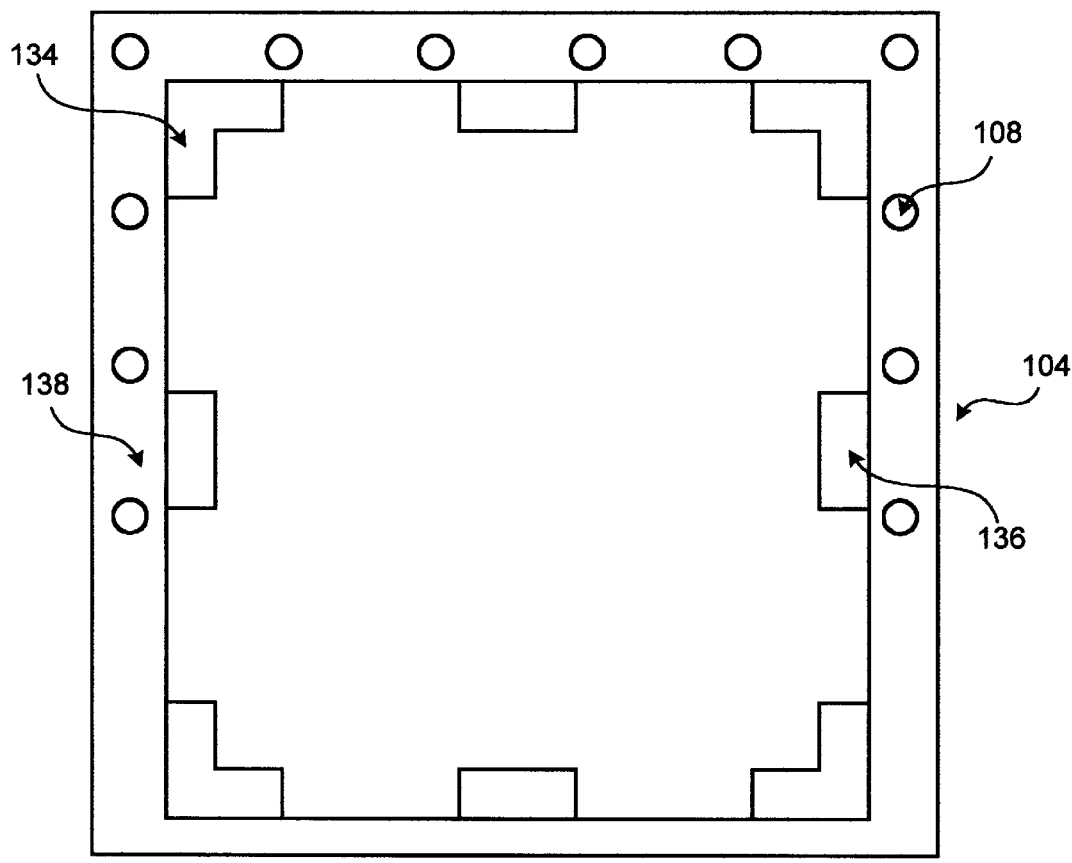
FIG. 1D is a top plan view of the bottom portion of the electronic shielding enclosure of an embodiment of the present invention.

Referring now to FIG. 1D, the top plan view of bottom portion 104 of electronic shielding enclosure 100 of an embodiment of the present invention is shown. Corner mounting brackets 134, and side mounting brackets 138, for mounting circuit assembly 132 in bottom portion 104 of enclosure 100 are also shown. Mounting brackets 134 include a securing means, not shown, which can be screws, pins, snap locks, epoxy, hooks, or other securing means to securely mount circuit assembly 132 to bottom portion 104 of enclosure 100. Mounting brackets 134 and 138 are designed to secure circuit assembly 132 so that an insulating gap is maintained between circuit assembly 132 and enclosure 100, thus preventing a short circuit of circuit assembly 132. It will be clear to one skilled in the art that many possible geometries for mounting brackets 132 and 134 are possible including a single continuous mounting bracket positioned around the perimeter of bottom portion 104, multiple posts within bottom portion 104 away from the perimeter, or other configurations. These configurations are within the scope of the present invention.

Referring again to FIG. 1A, openings 110 are positioned on hinged-edge 116 to allow wires 112 to pass through enclosure 100. Openings for wire clearance may be generous in size or may take the form of one or several large openings through which multiple wires may pass. Wires 112 can be comprised of any type of conductive material, including leads, pins, and the like, and are used to transmit signals to and from circuit assembly 132. Wires 112 are insulated so that they do not make conductive contact with enclosure 100.

Openings 110 also serve to provide airflow and cooling of enclosure 100. Additional openings may be added to increase airflow and cooling.

Circuit assembly 132 contains sub-isolation regions 142, 144, 146, and 148. Each region is surrounded by a portion of ground trace 118. Gaps in the surrounding ground trace allow for non-grounded traces to provide input and output lines for sub-isolation regions 142, 144, 146, and 148. When enclosure 100 is folded closed along hinges 114, walls 122 of top portion 102 are pressed against ground trace 118, providing conductive contact between ground trace 118 and walls 122 of enclosure 100. Thus each sub-isolation region 142, 144, 146, and 148 is surrounded by a corresponding sub-enclosure 150, 120, 152, and 154. The sub-enclosures provide electromagnetic shielding for the sub-isolation regions.

The flexibility of the composite material comprising enclosure 100 allows for walls 122 to press firmly against ground trace 118 when enclosure 100 is closed. Walls 122 can thus form a tight conductive seal with ground trace 118. Additionally, an elastomeric bead, not shown, can be placed along ground trace 118. The elastomeric bead is comprised of a compressible conductive material which bridges any gaps to ensure that a consistent, tight conductive seal is maintained between walls 122 and ground trace 118. The elastomeric bead can be formed of a variety of materials, such as PVC, polyester, or the like.

As an alternative to an elastomeric bead fit for providing a seal, a compression fit or interlocked joint may be used.

A conductive metal bar 124 is mounted to ground trace 118 along hinged-edge 114. Bar 124 provides conductive contact to ground trace 118 and protrudes through enclosure 100 at three places evenly spaced along hinged-edge 116. Protruding regions of bar 124 provide a structural mount for securely attaching enclosure 100 and circuit assembly 132 within a larger electronic device such as a cable modem. The protruding regions of bar 124 are also coupled to ground, so as to provide solid grounding for ground trace 118.

Enclosure 100 folds closed along hinges 114 and locks shut by the mating of locking snaps 106 along edge 140 of top portion 102 with holes 108 along edge 138 of bottom portion 104. An elastomeric bead, as described above, can also be compressed between edges 138 and 140 to provide a consistent, tight, conductive seal between top portion 102 and bottom portion 104 of enclosure 100. The snaps 106 are locked into holes 108 by applying pressure, thus allowing simple inexpensive assembly without the risk of heat damage to circuit assembly 132. Furthermore, the snap locks 106 can easily be unlocked, providing easy access to circuit assembly 132. Other locking mechanisms, such as clamps, screws, latches and the like, can be used to conductively couple edges 138 and 140, and are covered within the scope of the present invention.

Referring to FIG. 1B, a cross-sectional view of an embodiment of the shielded electronic circuit assembly of the present invention along line 1—1 of FIG. 1A is shown. Enclosure 100 is molded so that top portion 102 conforms to or matches the surface of circuit assembly 132, leaving an insulating gap between the inner surface of top portion 102 and the outer surface of circuit assembly 132. Ideally, the size of the insulating gap is just large enough to prevent enclosure 100 from short-circuiting circuit assembly 132. A typical gap size is 5 mm or less; however, a considerably larger gap size can be used depending on a variety of factors, including the degree of shielding required and the operating frequency of the circuit.

Edge 140 of top portion 102 is conductively coupled to edge 138 of bottom portion 104. Edge 140 bends slightly upward at a distal end and flattens out to form wall 122 which is in conductive contact with ground trace 118. Wall 122 bends upward and flattens to cap sub-enclosure 120 of sub-isolation region 144. Top portion 102 then bends down to form wall 122, conductively contacting ground trace 118 and surrounding circuit component 128 in sub-isolation region 144. Circuit component 128 can be a single-circuit component or a plurality of components. Furthermore, circuit component 128 can have a more complex geometry, requiring more contours in top portion 102 in order to maintain an insulating gap between top portion 102 and circuit assembly 132.

Top portion 102 bends upward from wall 122 on the distal end of sub-enclosure 120 to form the cap of sub-enclosure 152. Top portion 102 then bends down to form wall 122 on the distal end of sub-enclosure 152 which is in conductive contact with ground trace 118. Thus sub-isolation region 146 is surrounded by sub-enclosure 152. Sub-enclosure 152 is shaped so as to maintain an insulating gap between top portion 102 and circuit assembly 132. Sub-enclosure 152 can be of varied and complex shape to accommodate the circuit component or components found in sub-isolation region 146.

Top portion 102 then bends upward and flattens coupling at top hinge 114 to hinged edge 116, forming an additional sub-enclosure surrounding bar 124. Hinged-edge 116 is coupled to bottom portion at bottom hinge 114 to bottom portion 104 which extends underneath circuit assembly 132, bending up at the proximal end to form edge 138.

By closely conforming to or matching the geometry of circuit assembly 132, enclosure 100 helps to provide improved shielding over a wider range of frequencies than would a rectangular-geometry shield in which the height of the shield is determined by the height of the tallest components on circuit assembly 132. In addition, the sub-enclosure of sub-isolation regions 144 and 146 provides additional protection against interference between circuit elements within these regions.

Referring to FIG. 1C, a side elevation view facing the hinged edge of an embodiment of the shielded electronic circuit assembly of the present invention is shown. Holes 100 for wires 112 on hinged-edge 116 of enclosure 100 are shown, along with mounting bar 124 protruding from hinged-edge 116 in three places as described above.

Figure 2:
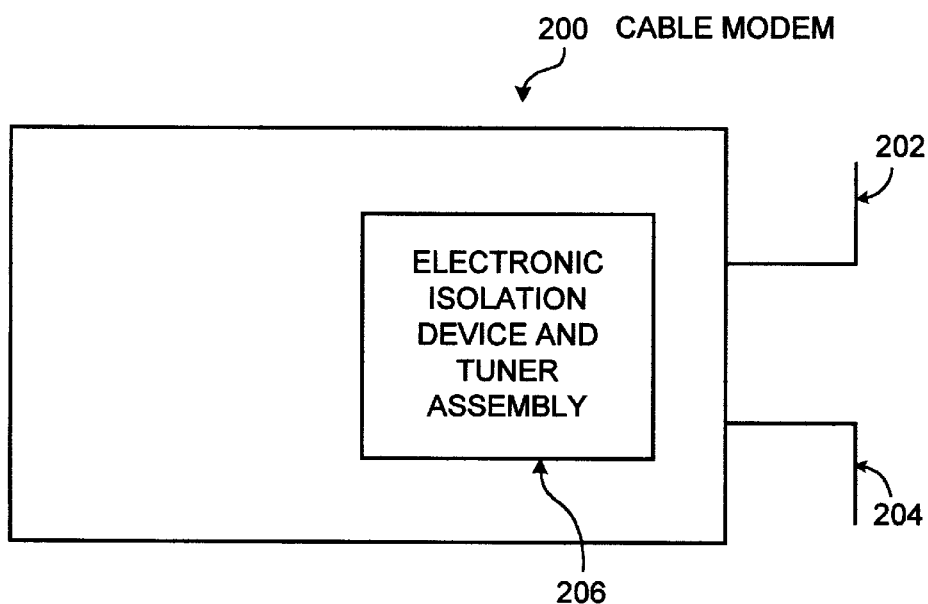
FIG. 2 is a schematic representation of an embodiment of the present invention in which the shielded electronic circuit assembly is implemented within a cable modem.

Referring to FIG. 2, a schematic representation of an embodiment of the present invention in which the shielded electronic circuit assembly is implemented within a cable modem 200 is shown. Leads 202 and 204 provide input and output signals to cable modem 200. Enclosed within cable modem 200 is shielded electronic tuner assembly 206.

Though the invention has been described by reference to certain embodiments thereof, the invention is not to be so limited and is to be limited only by the appended claims.

What is claimed is:

1. An apparatus for use within an electronic device comprising:
   al electronic circuit assembly; and an enclosure comprising (a) a nonmetallic structural material sufficient to hold form and support the circuit assembly and (b) a conductive material; wherein
   the enclosure is conductively coupled to ground and closes along a perimeter so as to provide conductive contact along the perimeter, the structural material and the conductive material surrounding the electronic circuit assembly when the enclosure is closed;
   wherein the enclosure is shaped to form sub-enclosure isolating a first portion of the electronic circuit assembly from a second portion of the electronic circuit assembly, wherein a perimeter of the sub-enclosure is in conductive contact with a ground trace at least partially surrounding the portion of the electronic circuit assembly being isolated and wherein a shape of the enclosure matches a shape of the electronic circuit assembly, such that an insulating gap is maintained between a surface of the enclosure and the surface of the electronic circuit assembly.

2. The apparatus of claim 1, wherein the conductive material is embedded within the nonmetallic structural material.

3. The apparatus of claim 1, wherein the nonmetallic structural material is laminated with the conductive material.

4. The apparatus of claim 1, wherein the conductive material is coated on the nonmetallic structural material.

5. The apparatus of claim 1, further including a hinge positioned along a hinged edge of the enclosure, the hinge non-detachably coupling a bottom portion of the enclosure to a top portion of the enclosure.

6. The apparatus of claim 5, further comprising an elastomeric conductive bead compressed and providing increased conductivity between the top portion of the enclosure and the bottom portion of the enclosure.

7. The apparatus of claim 5, further comprising an interlocked joint providing increased conductivity between the top portion of the enclosure and the bottom portion of the enclosure.

8. The apparatus of claim 5, further comprising a compression fit providing increased conductivity between the top portion of the enclosure and the bottom portion of the enclosure.

9. The apparatus of claim 5, further comprising at least one opening positioned on the hinged edge of the enclosure through which conductive wires can pass allowing electronic signals to be input to and output from the electronic circuit assembly.

10. The apparatus of claim 1, the enclosure forming an opening for the passage of air for cooling the electronic circuit assembly.

11. The apparatus of claim 1, further comprising a mounting bracket coupled to the enclosure, the bracket coupling the electronic circuit assembly to the enclosure such that the conductive material does not short-circuit the electronic circuit assembly.

12. The apparatus of claim 1, wherein the enclosure reduces electromagnetic interference by at least 60 dB over a frequency range from 10 MHz to 4 GHz.

13. The apparatus of claim 1, further comprising an elastomeric conductive bead compressed between a perimeter of the sub-enclosure and the ground trace, the bead providing conductive contact between the sub-enclosure and the ground trace.

14. The apparatus of claim 1, further comprising an interlocked joint, the joint providing conductive contact between the sub-enclosure and the ground trace.

15. The apparatus of claim 1, further comprising a compression fit, the compression fit providing conductive contact between the sub-enclosure and the ground trace.

16. The apparatus of claim 1, wherein the enclosure is shaped to form a plurality of sub-enclosures, each sub-enclosure isolating a portion of the electronic circuit assembly wherein a perimeter of each sub-enclosure is in conductive contact with the ground trace at least partially surrounding the portion of the electronic circuit assembly being isolated.

17. The apparatus of claim 1, wherein the nonmetallic structural material comprises a plastic or polymer.

18. The apparatus of claim 1, wherein the conductive material comprises silver.

19. The apparatus of claim 1, wherein the conductive material comprises copper.

20. The apparatus of claim 1, wherein the conductive material comprises copper and silver.

21. The apparatus of claim 1, wherein the conductive material comprises at least one of copper, aluminum, silver and gold.

22. The apparatus of claim 1, wherein the electronic circuit assembly comprises a tuner for a cable modem.

23. An apparatus for a cable modem comprising:

an electronic tuner assembly, a nonmetallic structural material sufficient to hold and support the electronic tuner assembly and a conductive material, the conductive material providing electromagnetic-interference shielding, the structural material and the conductive material forming an enclosure both materials of the enclosure surrounding the electronic tuner assembly, the enclosure including a top portion, a bottom portion, and a locking mechanism allowing the top portion to be held in conductive contact with the bottom portion, wherein the enclosure further contains at least one opening through which conductive wires can pass allowing electronic signals to be input to and output from the electronic tuner assembly; and a mounting bracket coupled to the enclosure, the bracket coupling the electronic tuner assembly to the enclosure such that the conductive material does not short-circuit the electronic tuner assembly; and wherein a shape of the enclosure matches a shape of the electronic tuner assembly, such that an insulating gap is maintained between an inside surface of the enclosure and a surface of the electronic tuner assembly, the enclosure reducing electromagnetic interference by at least 60 dB over a frequency range from 10 MHz to 4 GHz; and wherein the enclosure is conductively coupled to ground.

24. The apparatus of claim 23, further including a hinge positioned along a hinged edge of the enclosure, non-detachably coupling the bottom portion of the enclosure to the top portion of the enclosure.

25. The apparatus of claim 24, wherein the opening is positioned on the hinged edge of the enclosure.

26. The apparatus of claim 23, wherein the enclosure is shaped to form a sub-enclosure isolating a first portion of the electronic tuner assembly from a second portion of the electronic tuner assembly, wherein a perimeter of the sub-enclosure is in conductive contact with a ground trace at least partially surrounding the portion of the electronic tuner assembly being isolated.

27. The apparatus of claim 26, further comprising an elastomeric conductive bead compressed between a perimeter of the sub-enclosure and the ground trace, the bead providing conductive contact between the sub-enclosure and the ground trace.

28. The apparatus of claim 26, wherein the enclosure is shaped to form a plurality of sub-enclosures, each isolating a portion of the electronic tuner assembly wherein the perimeter of each sub-enclosure is in conductive contact with a ground trace at least partially surrounding the portion of the electronic tuner assembly being isolated.

29. The apparatus of claim 23, wherein the structural material comprises a plastic or polymer.

30. The apparatus of claim 23, wherein the conductive material comprises at least one of copper, aluminum, silver and gold.

31. The apparatus of claim 23, further comprising an elastomeric conductive bead compressed and providing increased conductivity between the top portion of the enclosure and the bottom portion of the enclosure.

* * * * *